(12) United States Patent
Song et al.

(10) Patent No.: US 7,906,356 B2
(45) Date of Patent: Mar. 15, 2011

(54) METHOD OF MANUFACTURING ARRAY SUBSTRATE OF HORIZONTAL ELECTRIC FIELD TYPE TRANSREFLECTIVE LIQUID CRYSTAL DISPLAY

(75) Inventors: Young Suk Song, Beijing (CN); Seung Jin Choi, Beijing (CN); Seong Yeol Yoo, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 10 days.

(21) Appl. No.: 12/547,846

(22) Filed: Aug. 26, 2009

(65) Prior Publication Data

US 2010/0055817 A1   Mar. 4, 2010

(30) Foreign Application Priority Data

Aug. 27, 2008   (CN) .......................... 2008 1 0119139

(51) Int. Cl.
*H01L 21/00* (2006.01)
(52) U.S. Cl. ..................... 438/30; 349/38; 257/E21.158; 257/E21.535

(58) Field of Classification Search .................... 438/30; 349/38; 257/E21.158, E21.535
See application file for complete search history.

(56) References Cited

U.S. PATENT DOCUMENTS 7,656,500 B2 *   2/2010   Ahn ............................... 349/190
7,688,414 B2 *   3/2010   Oh et al. ....................... 349/141

FOREIGN PATENT DOCUMENTS

KR   1020070080476 A   8/2007
KR   1020070114472 A   12/2007

* cited by examiner

*Primary Examiner* — David S Blum
(74) *Attorney, Agent, or Firm* — Ladas & Parry LLP

(57) ABSTRACT

A method of manufacturing an array substrate of horizontal electric field type transreflective LCD is provided in the invention. An array substrate of liquid crystal display is obtained by using one full tone mask and two dual tone masks according to the method. Specifically, the gate line, the gate electrode and the display region are formed by using a full tone mask, the thin film transistor, the transmissive region and the reflective region on the electrode are formed by using a first dual tone mask, and the via hole and the electrode with slits are formed by using a second dual tone mask.

13 Claims, 18 Drawing Sheets

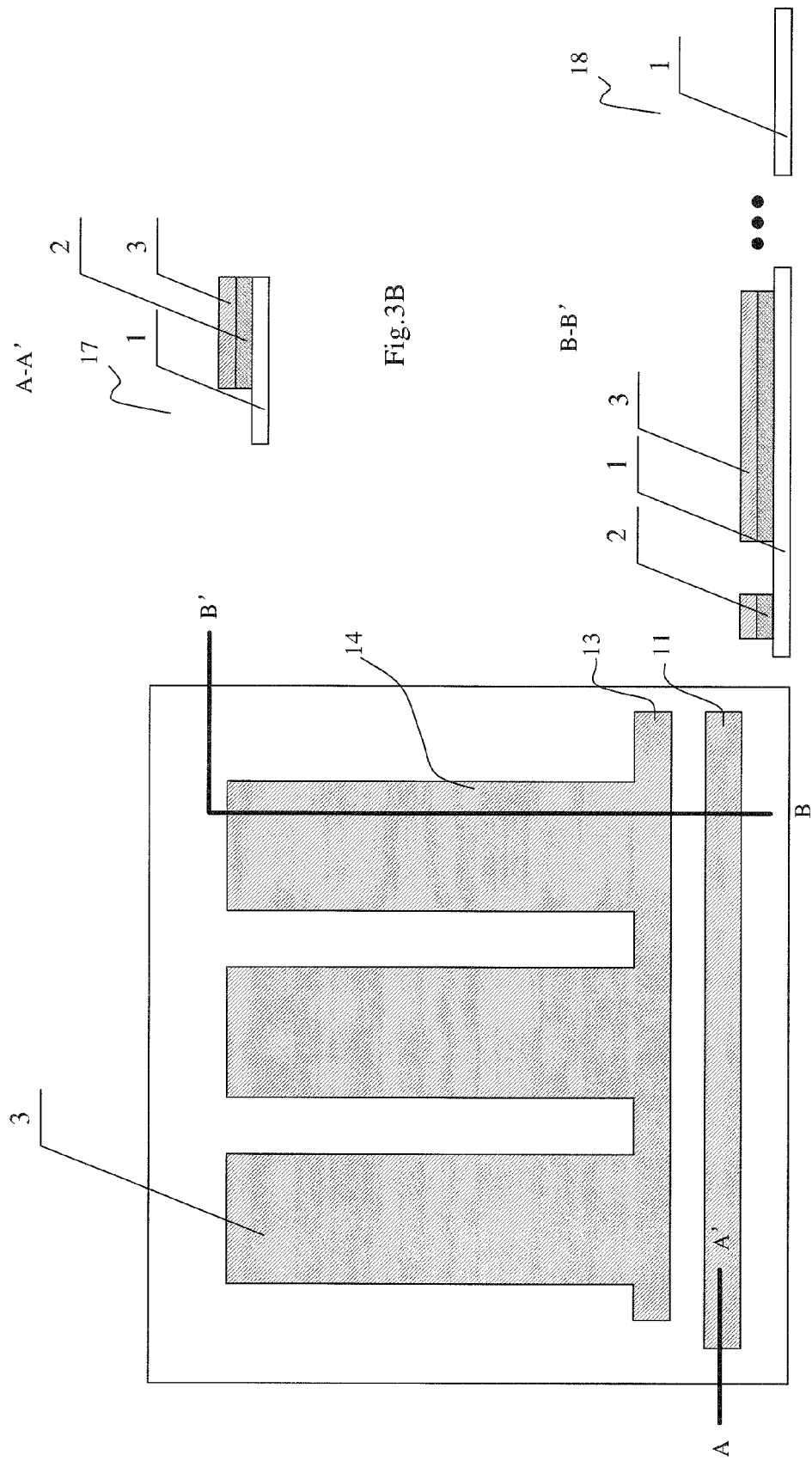

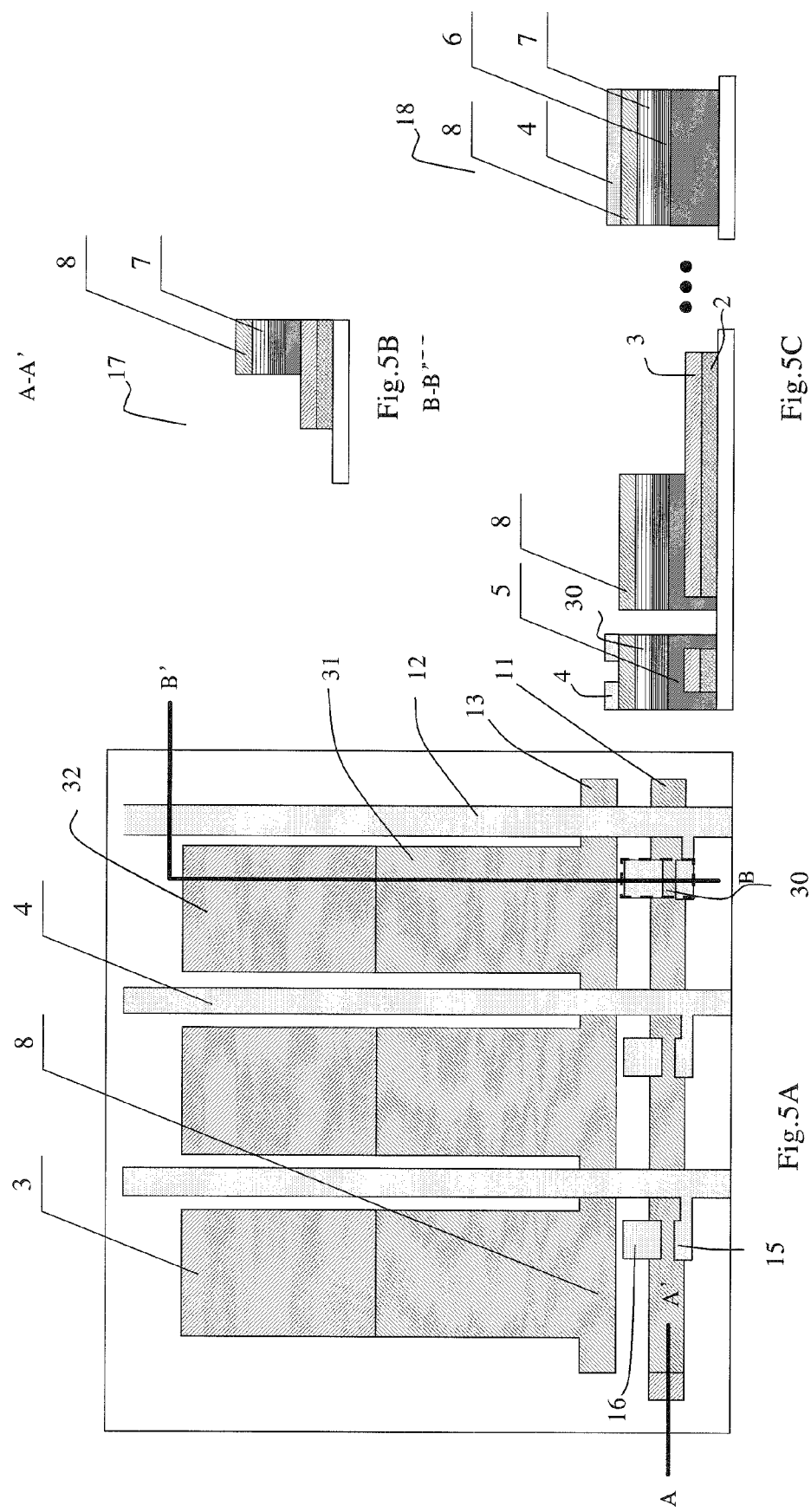

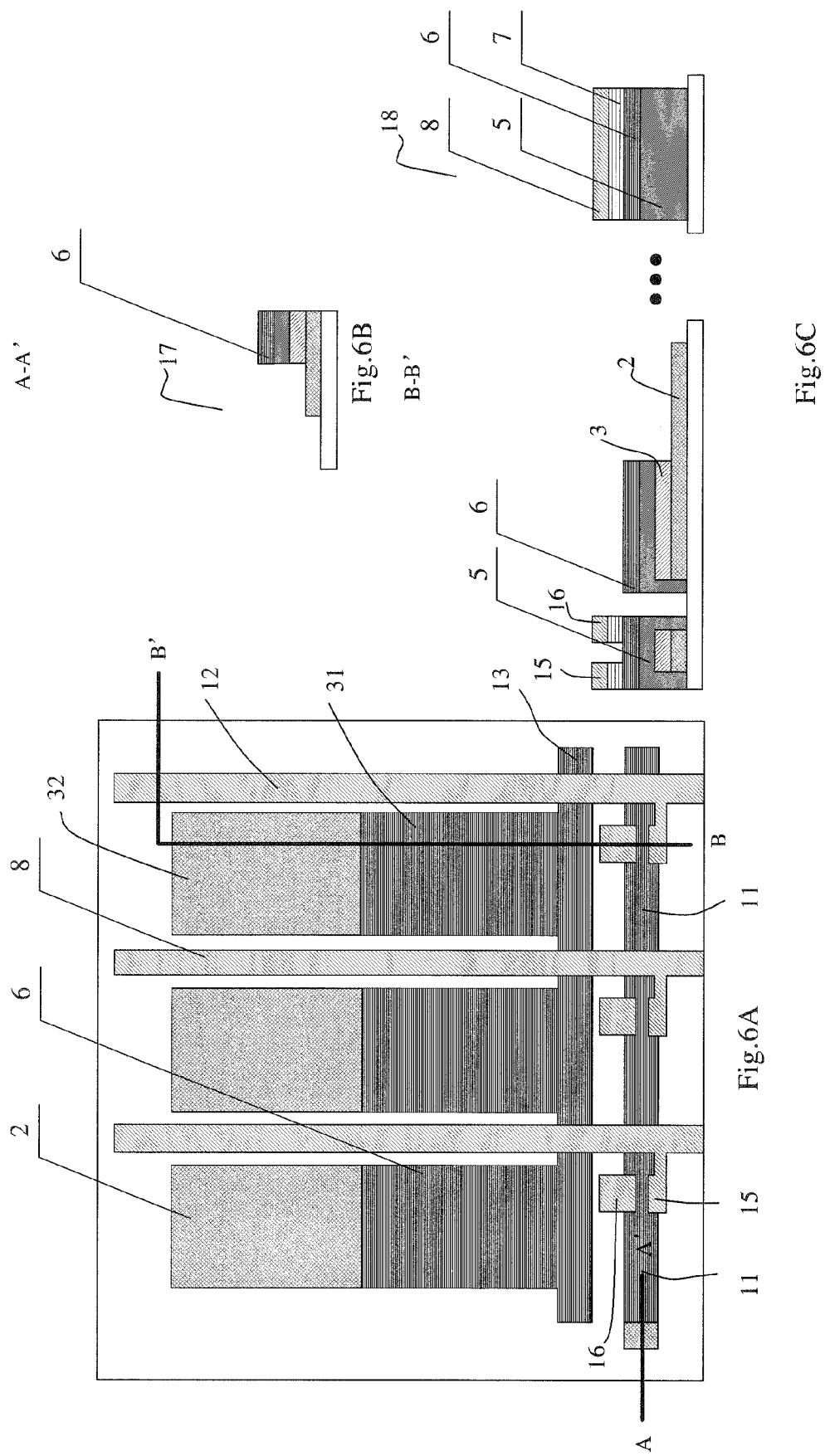

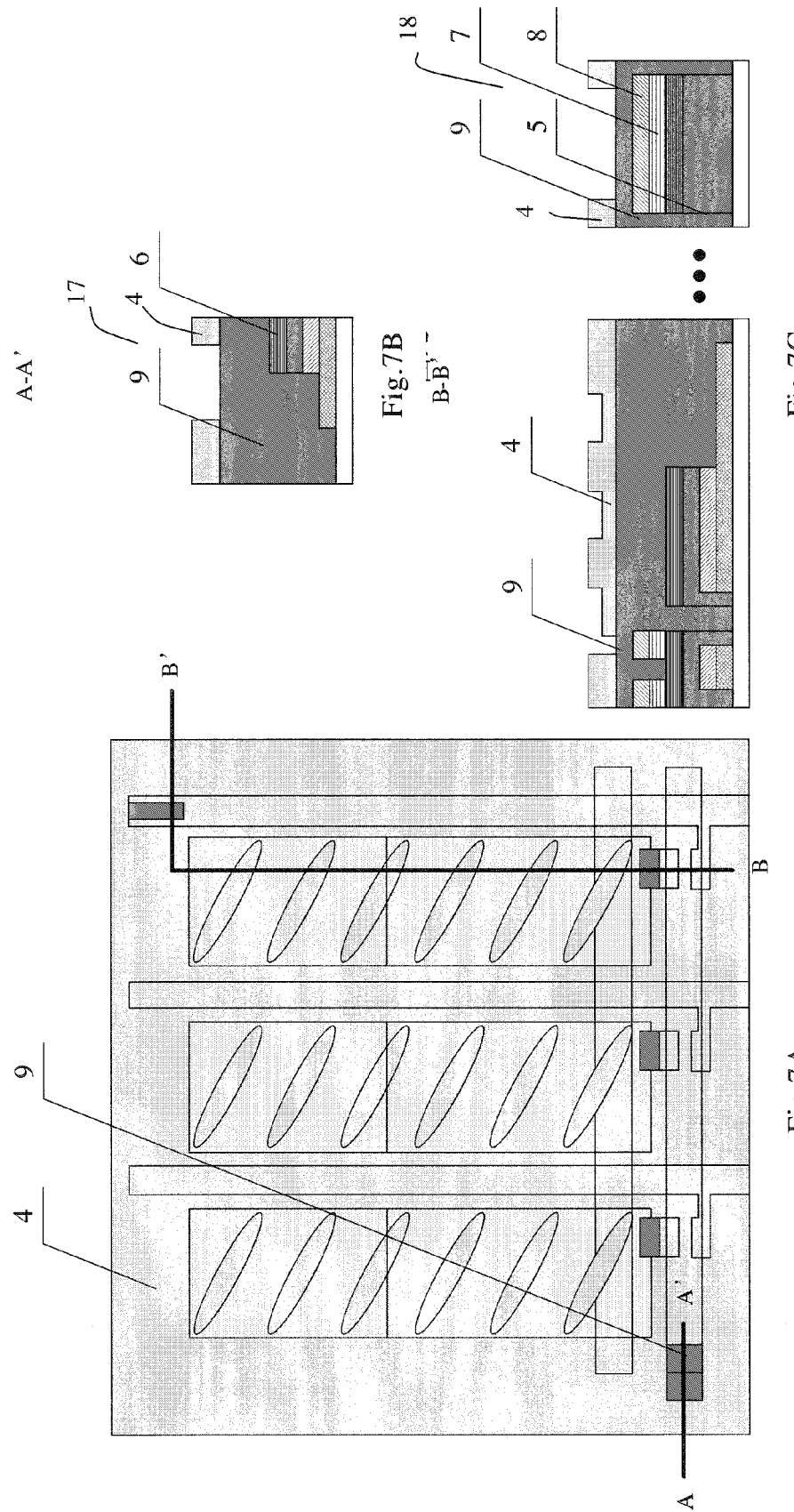

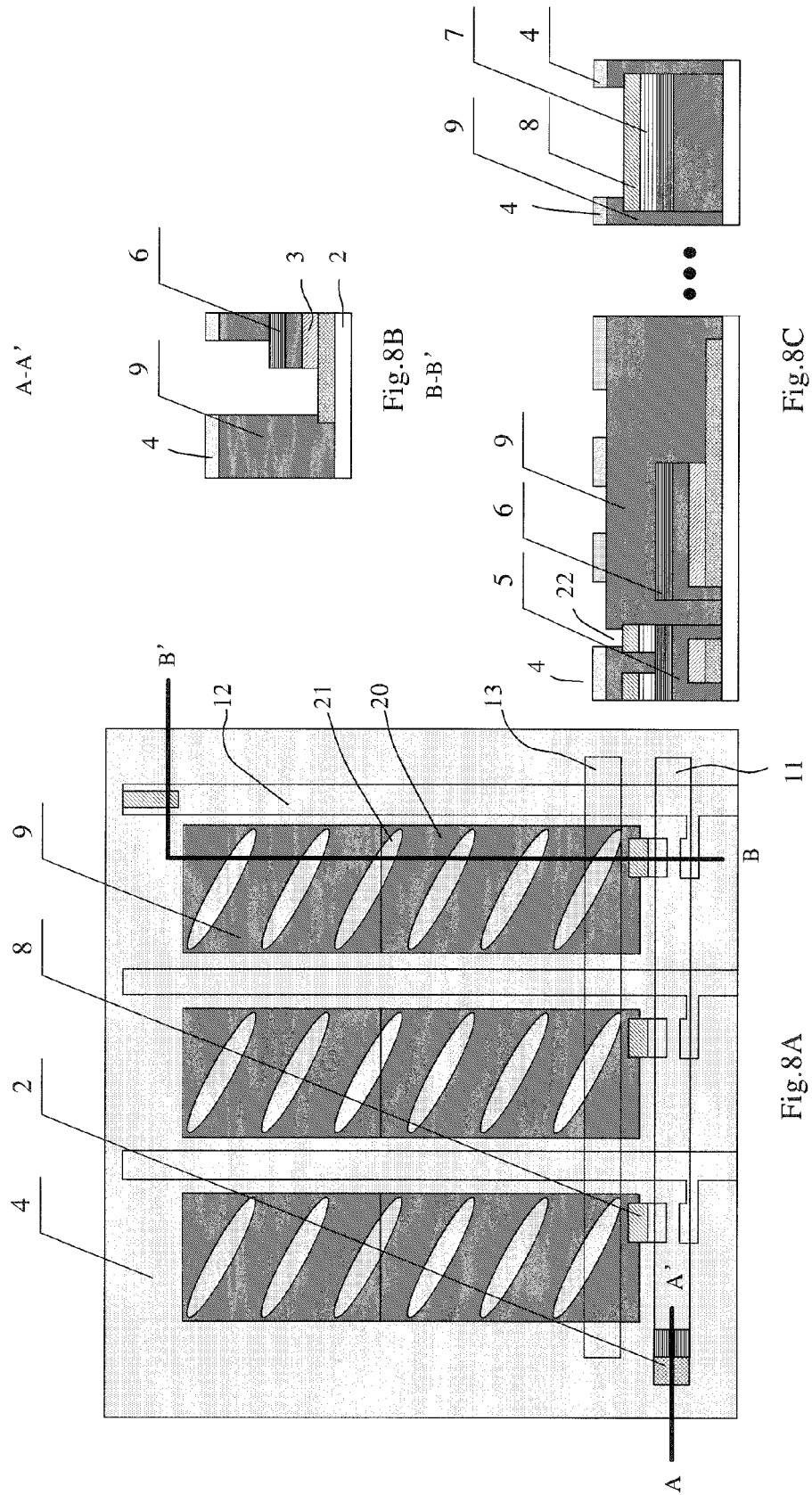

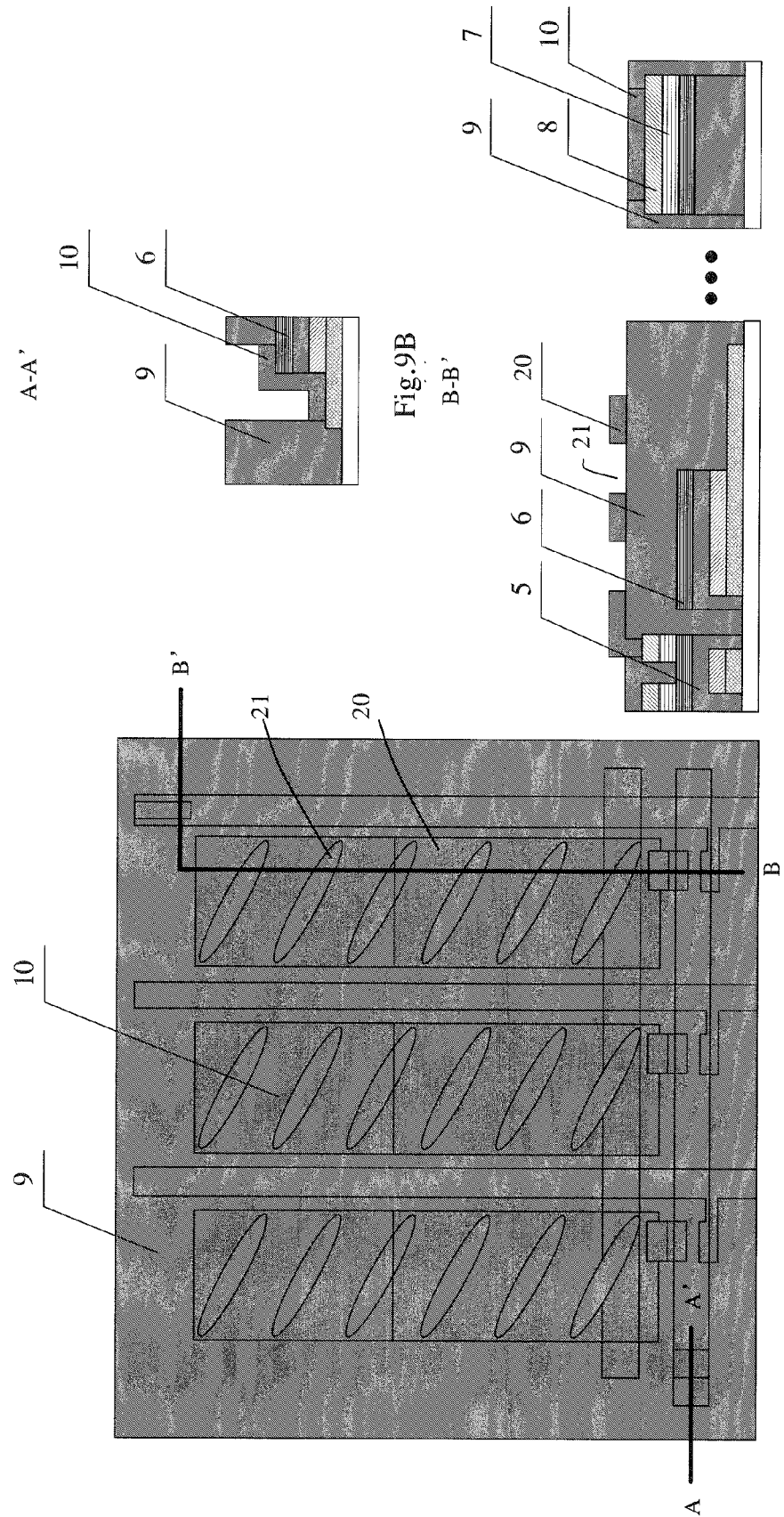

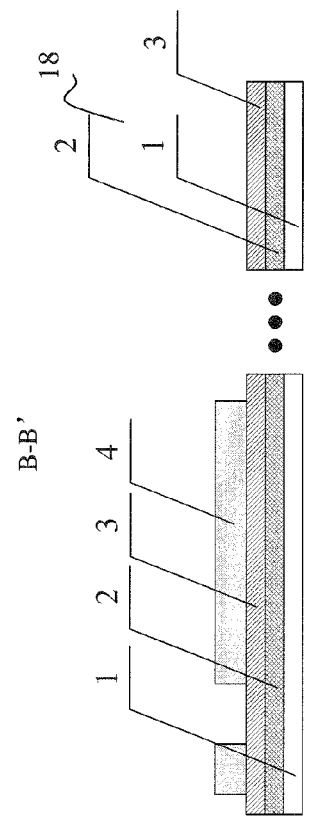
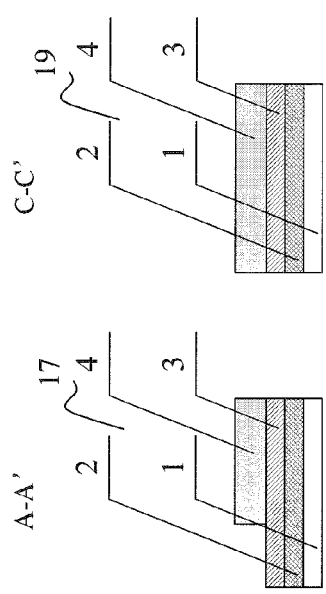
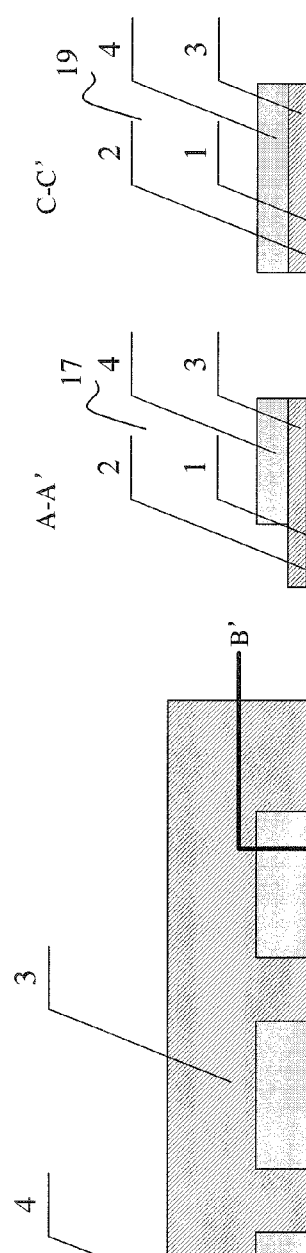
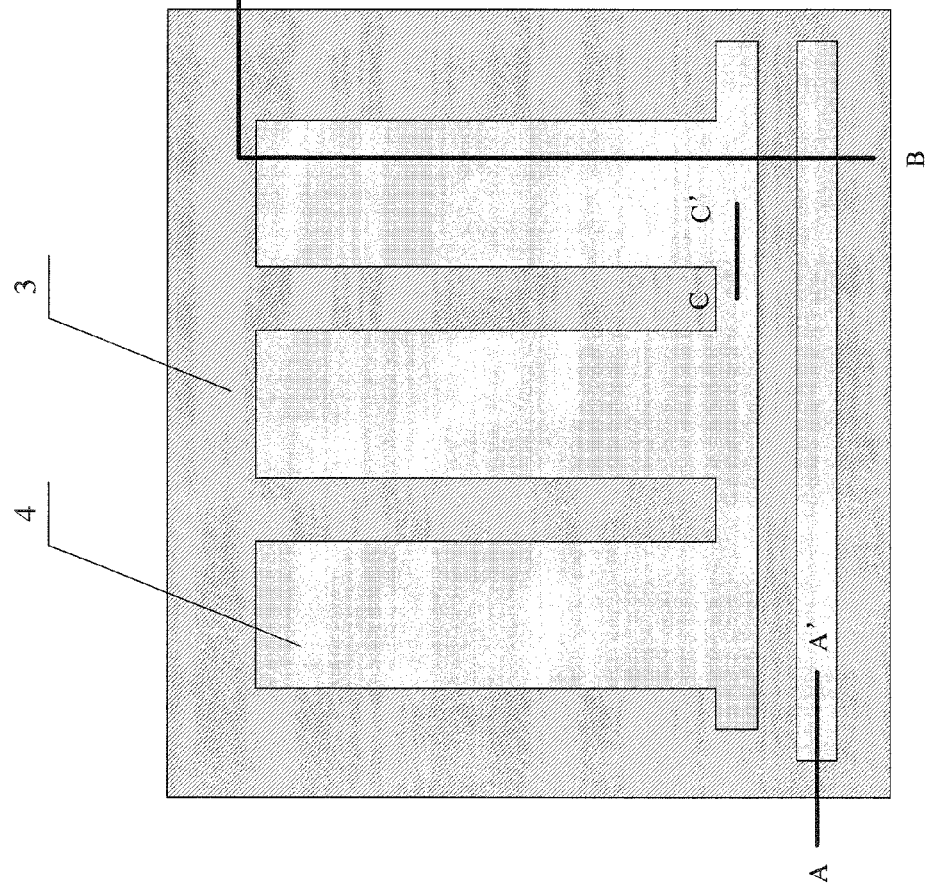
Fig.11A

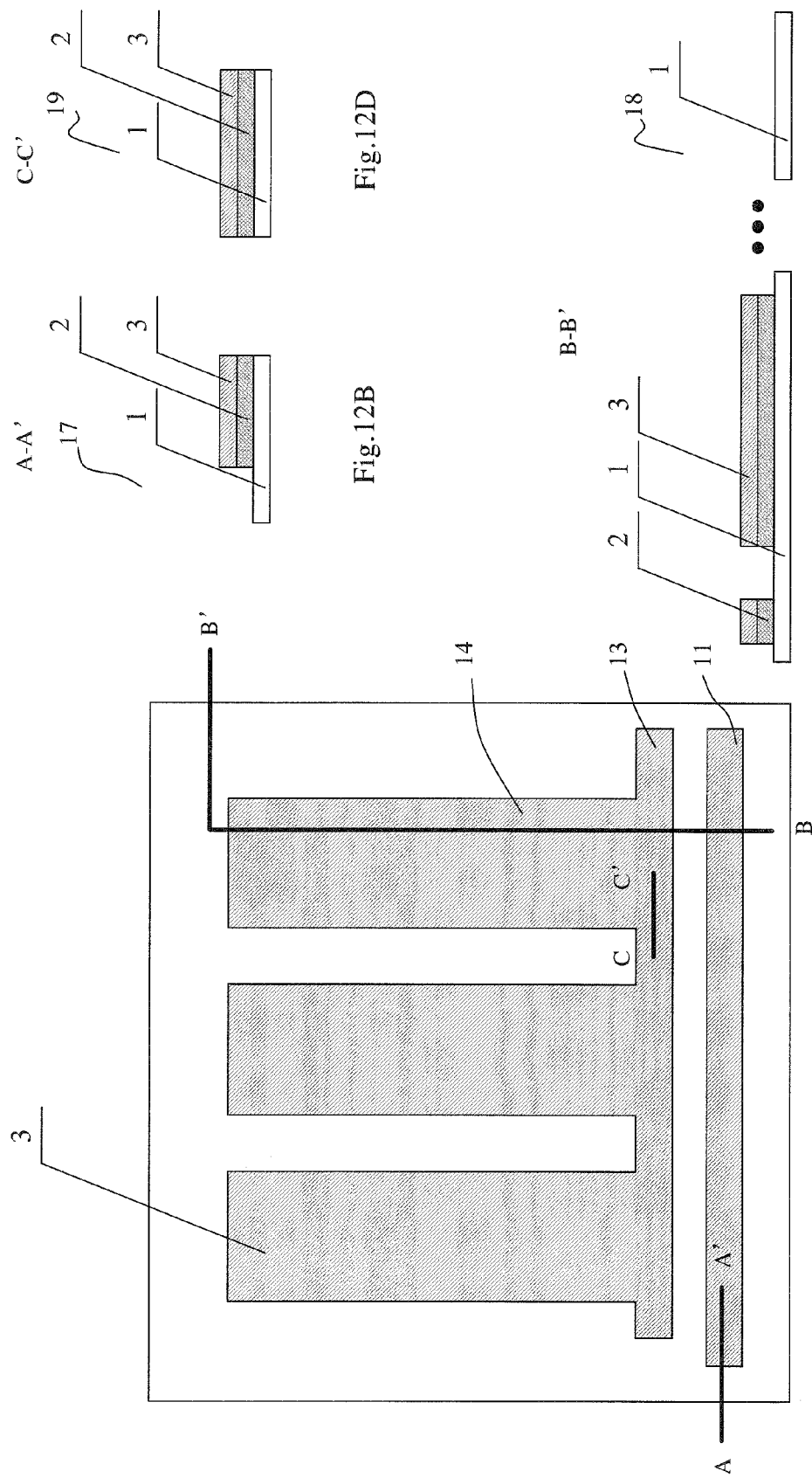

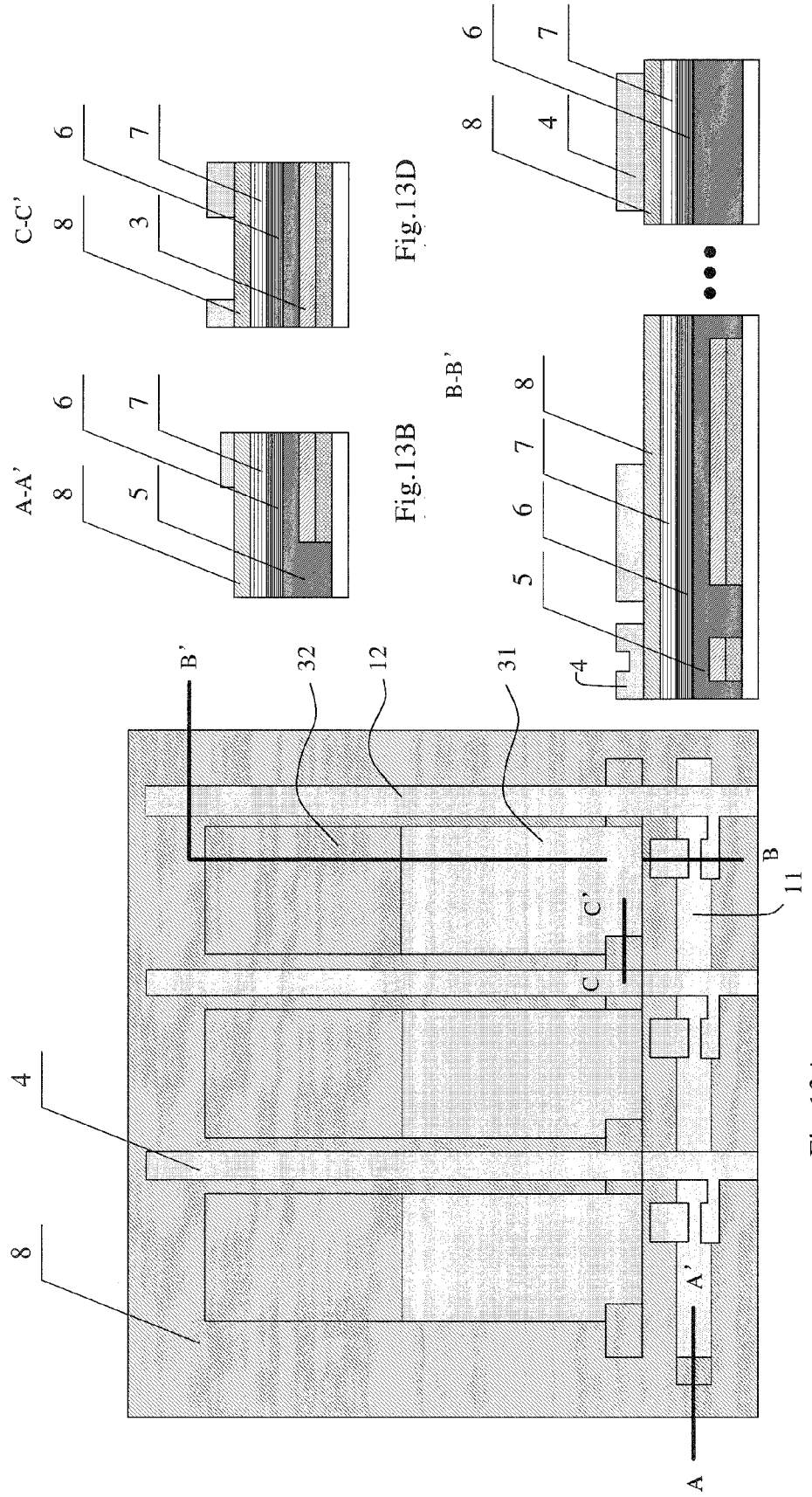

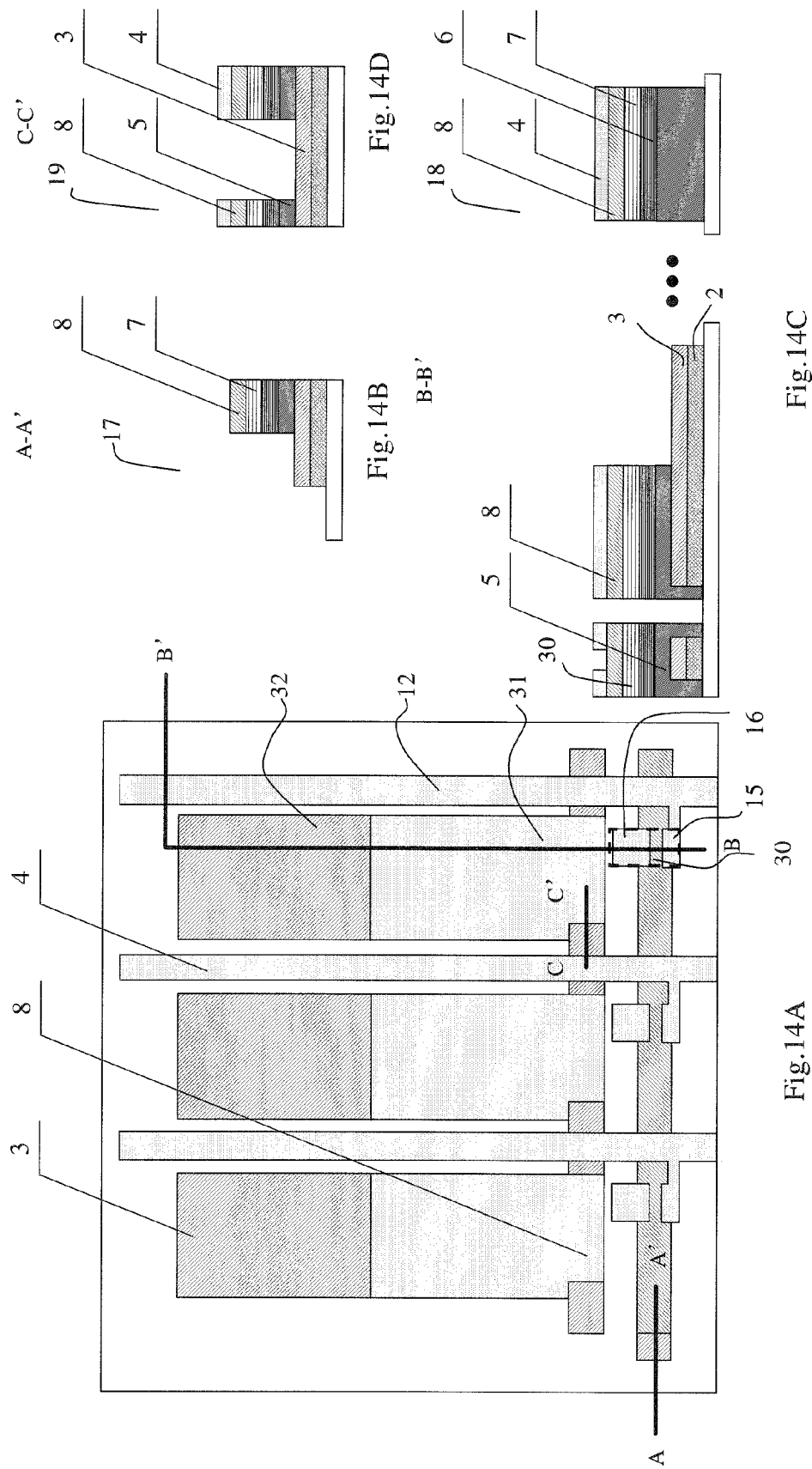

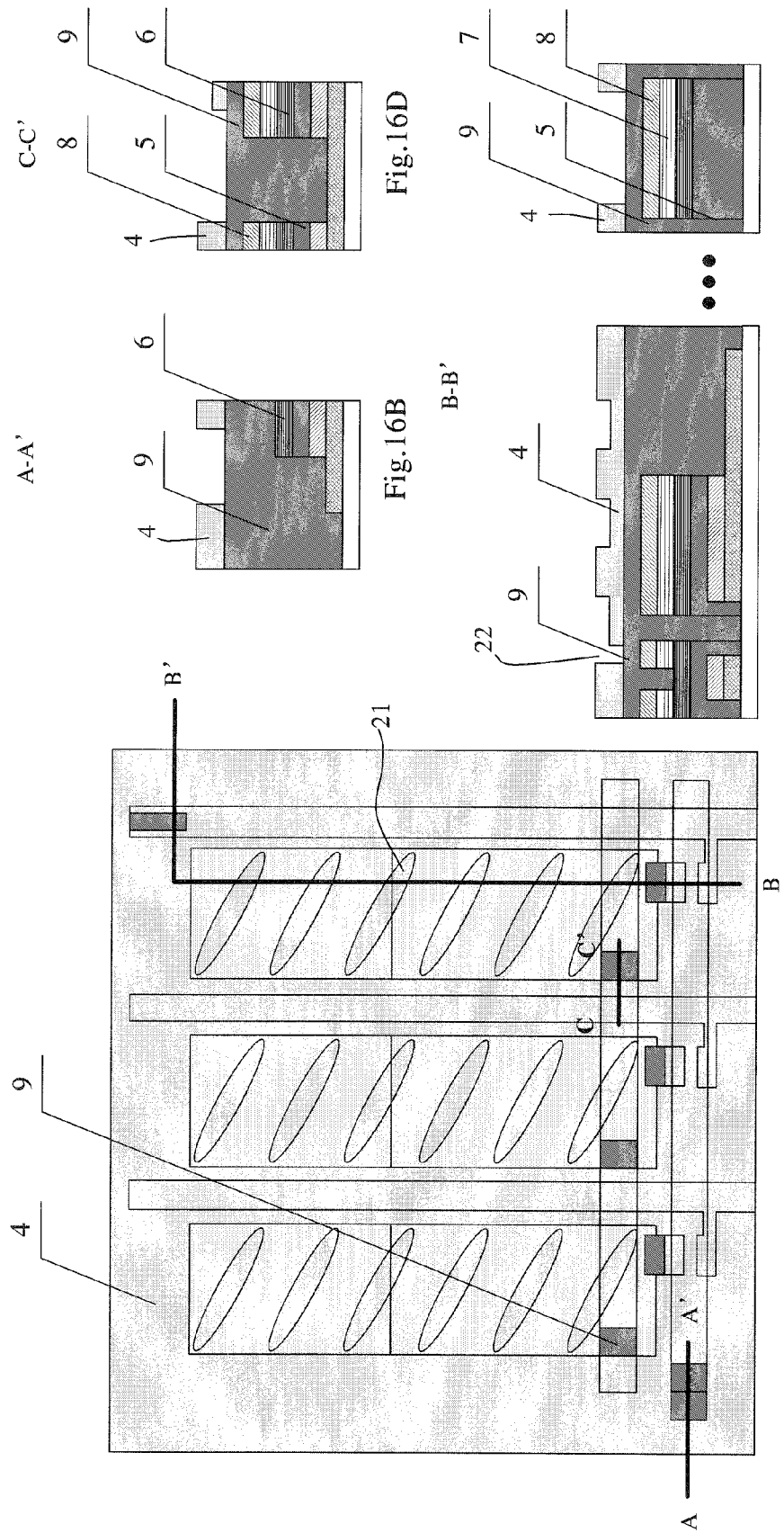

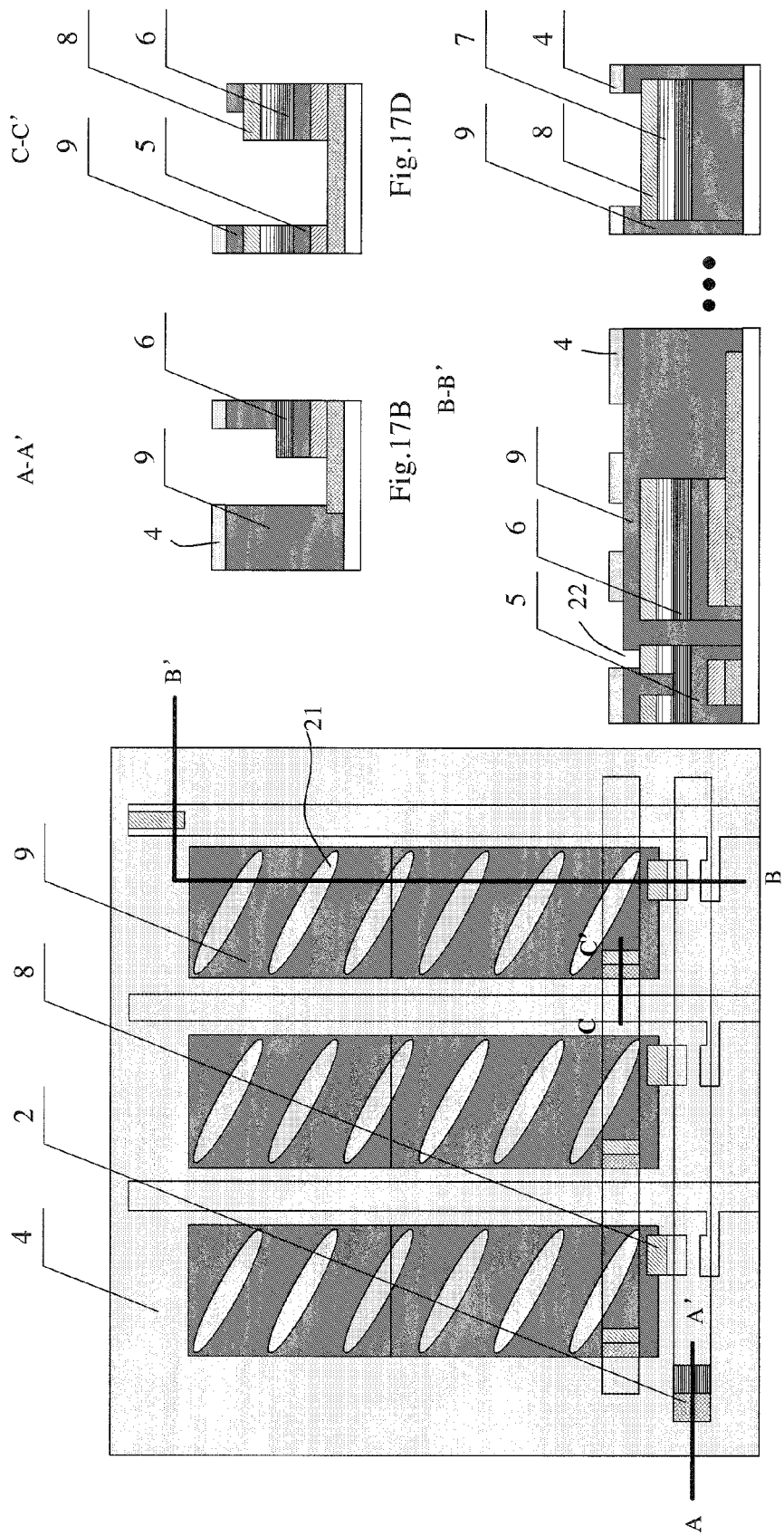

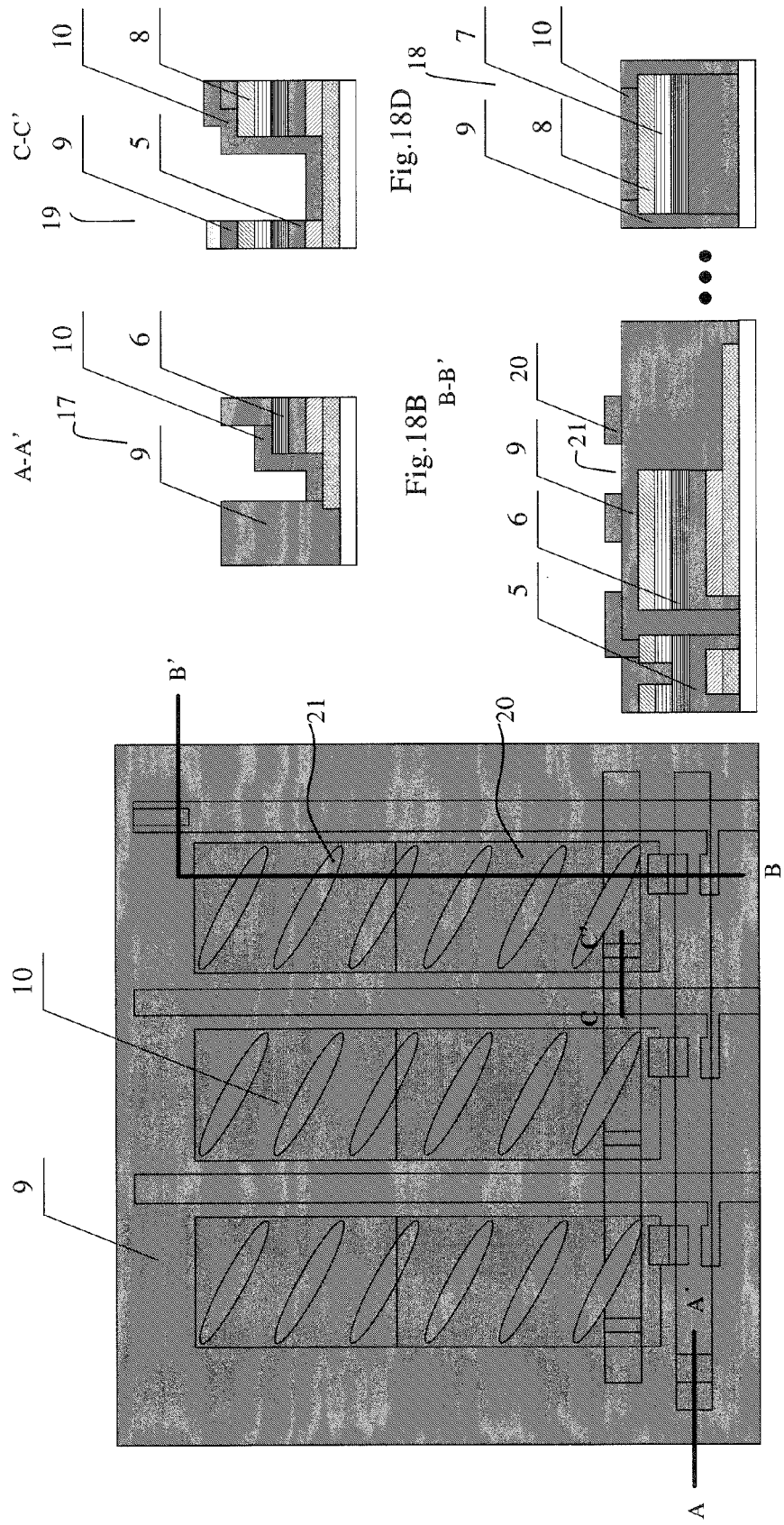

METHOD OF MANUFACTURING ARRAY SUBSTRATE OF HORIZONTAL ELECTRIC FIELD TYPE TRANSREFLECTIVE LIQUID CRYSTAL DISPLAY

BACKGROUND

Embodiments of the present invention relate to a method of manufacturing an array substrate of horizontal electric field type transreflective liquid crystal display.

Recently, liquid crystal displays (LCDs) have prevailed in the market of flat panel displays (FPDs). LCDs can be divided as a vertical electric field type and a horizontal electric field type according to the direction of the electric field applied for driving the liquid crystal molecules. A twist nematic (TN) LCD belongs to the vertical electric field type; and a fringe field switching (FFS) LCD and an in-plane switching (IPS) LCD belong to the horizontal electric field type.

In the vertical electric field type LCD, the pixel electrode is formed on an array substrate and the common electrode is formed on a color filter substrate; however, in the horizontal electric field type LCD, both the pixel electrode and the common electrode are formed on the same array substrate. Therefore, an additional process to form the common electrode is required during manufacturing the array substrate of the horizontal electric field type LCD compared with the method for manufacturing the array substrate of the vertical electric field type LCD.

In addition, LCDs can be divided into transmissive, transreflective, and reflective types according to the light for display. Images are displayed by transmitting the light from the backlight in the transmissive LCD, by transmitting the light from the backlight and reflecting the light from the external environment in the transreflective LCD, and by reflecting the light from the external environment in the reflective LCD.

The pixel electrode can be formed of a reflective metal as a reflective plate in the reflective LCD and of a transparent conductive material in the transmissive LCD. In the transreflective LCD, the pixel electrode in the reflective region can be formed of a reflective metal as a reflective plate and the pixel electrode in the transmissive region can be formed of a transparent conductive material.

In order to improve the reflection efficiency of the reflective plate in a reflective LCD or a transreflective LCD, an embossing pattern is formed below the reflective plate so that uneven patterns are formed on the surface of the reflective electrode or the reflective plate.

In addition, many researches have been carried out widely to cut down production cost by reducing the mask number used in producing and improve production efficiency by simplifying the process.

A method of manufacturing an array substrate of a horizontal electric field type liquid crystal display by using a three-mask process has been proposed in Korean patent applications Nos. 10-2006-0048069 and 10-2006-0011814. The method specifically comprises the following steps.

A first patterning process is conducted by subsequently depositing a common electrode layer and a first metal layer on a base substrate, patterning with a first dual tone mask to form a gate line with both the common electrode layer and the first metal layer and an electrode with the common electrode layer in the display region.

A second patterning process is conducted by subsequently depositing a first insulating layer, a semiconductor layer, a doped semiconductor layer, and a second metal layer, patterning with a second dual tone mask to form a TFT channel, a source/drain electrode and a data line.

A third patterning process is conducted by depositing a second insulating layer, patterning with a third dual tone mask to form a via hole in the second insulating layer, ashing the remained photoresist layer to thin the patterned photoresist layer, depositing a pixel electrode layer, and forming an electrode with slits after lifting off the remained photoresist.

Compared with an array substrate of transmissive liquid crystal display, a reflective plate and an embossing pattern below the reflective plate are added when manufacturing an array substrate of a transreflective LCD, and thus the mask number used in producing is increased.

SUMMARY OF THE INVENTION

A method of manufacturing an array substrate of horizontal electric field type transreflective liquid crystal display is provided in the invention. The method comprises the manufacture of a pre-preparing layer structure and the manufacture of a post-preparing layer structure. The formation of the pre-preparing layer structure comprises:

a first patterning process of forming a first transparent conductive layer and a first metal layer sequentially on a base substrate, coating a first photoresist layer on the first metal layer, exposing and developing the photoresist layer with a full tone mask to form a first photoresist pattern, etching with the first photoresist pattern to form patterns for a display region, a gate line and a gate electrode branching from the gate line, which are all formed of the first transparent conductive layer and the first metal layer;

a second patterning process of forming a first insulating layer, a semiconductor layer, a doped semiconductor layer and a second metal layer on the substrate after the first patterning process, coating a second photoresist layer, exposing and developing the second photoresist layer with a first dual tone mask to form a second photoresist pattern, etching with the second photoresist pattern to form a silicon island and a data line, and to expose the first metal layer in a transmissive region in the display region, performing ashing the second photoresist pattern and then etching again with the remained second photoresist pattern to form a channel on the silicon island, a source electrode connected with the data line and a drain electrode, and to form an electrode in the display region, wherein a reflective region of the electrode is formed of both the first transparent conductive layer and the first metal layer, and a transmissive region of the electrode is formed of the first transparent conductive layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 3A is a plane view after etching in the first patterning process of the method according to the first embodiment of the invention; FIG. 3B is a sectional view taken along a line A-A' in FIG. 3A; FIG. 3C is a sectional view taken along a line B-B' in FIG. 3A;

FIG. 5A is a plane view after etching and ashing the photoresist layer in the second patterning process of the method according to the first embodiment of the invention; FIG. 5B is a sectional view taken along a line A-A' in FIG. 5A; FIG. 5C is a sectional view taken along a line B-B' in FIG. 5A;

FIG. 6A is a plane view after etching once more and removing the photoresist layer in the second patterning process of the method according to the first embodiment of the invention; FIG. 6B is a sectional view taken along a line A-A' in FIG. 6A; FIG. 6C is a sectional view taken along a line B-B' in FIG. 6A;

FIG. 7A is a plane view after exposing and developing in a third patterning process of the method according to the first embodiment of the invention; FIG. 7B is a sectional view taken along a line A-A' in FIG. 7A; FIG. 7C is a sectional view taken along a line B-B' in FIG. 7A;

FIG. 8A is a plane view after etching in the third patterning process of the method according to the first embodiment of the invention; FIG. 8B is a sectional view taken along a line A-A' in FIG. 8A; FIG. 8C is a sectional view taken along a line B-B' in FIG. 3A;

FIG. 9A is a plane view after lifting-off the photoresist layer in the third patterning process of the method according to the first embodiment of the invention; FIG. 9B is a sectional view taken along a line A-A' in FIG. 9A; FIG. 9C is a sectional view taken along a line B-B' in FIG. 9A;

FIG. 11A is a plane view after exposing and developing with a full tone mask in a first patterning process of the method according to the second embodiment of the invention; FIG. 11B is a sectional view taken along a line A-A' in FIG. 11A; FIG. 11C is a sectional view taken along a line B-B' in FIG. 11A; FIG. 11D is a sectional view taken along a line C-C' in FIG. 11A;

FIG. 12A is a plane view after etching in the first patterning process of the method according to the second embodiment of the invention; FIG. 12B is a sectional view taken along a line A-A' in FIG. 12A; FIG. 12C is a sectional view taken along a line B-B' in FIG. 12A; FIG. 12D is a sectional view taken along a line C-C' in FIG. 12A;

FIG. 13A is a plane view after exposing and developing with a first dual tone mask in a second patterning process of the method according to the second embodiment of the invention; FIG. 13B is a sectional view taken along a line A-A' in FIG. 13A; FIG. 13C is a sectional view taken along a line B-B' in FIG. 13A; FIG. 13D is a sectional view taken along a line C-C' in FIG. 13A;

FIG. 14A is a plane view after etching and ashing the photoresist layer in the second patterning process of the method according to the second embodiment of the invention; FIG. 14B is a sectional view taken along a line A-A' in FIG. 14A; FIG. 14C is a sectional view taken along a line B-B' in FIG. 14A; FIG. 14D is a sectional view taken along a line C-C' in FIG. 14A;

FIG. 16A is a plane view after exposing and developing in a third patterning process of the method according to the second embodiment of the invention; FIG. 16B is a sectional view taken along a line A-A' in FIG. 16A; FIG. 16C is a sectional view taken along a line B-B' in FIG. 16A; FIG. 16D is a sectional view taken along a line C-C' in FIG. 16A;

FIG. 17A is a plane view after etching in the third patterning process of the method according to the second embodiment of the invention; FIG. 17B is a sectional view taken along a line A-A' in FIG. 17A; FIG. 17C is a sectional view taken along a line B-B' in FIG. 17A; FIG. 17D is a sectional view taken along a line C-C' in FIG. 17A; and FIG. 18A is a plane view after lifting-off the photoresist layer in the third patterning process of the method according to the second embodiment of the invention; FIG. 18B is a sectional view taken along a line A-A' in FIG. 18A; FIG. 18C is a sectional view taken along a line B-B' in FIG. 18A; FIG. 18D is a sectional view taken along a line C-C' in FIG. 18A.

DESCRIPTION OF THE EMBODIMENTS

In the embodiments of the invention, the layered structure that comprises at least gate lines, thin film transistors (TFTs), TFT channels and data lines is defined as a pre-preparing layer structure, and the layered structure that comprises at least pixel electrodes is defined as a post-preparing layer structure. In LCDs, a pixel region (or a display region) is defined by a gate line and a data line that intersects the gate line.

First Embodiment

Figure 1:
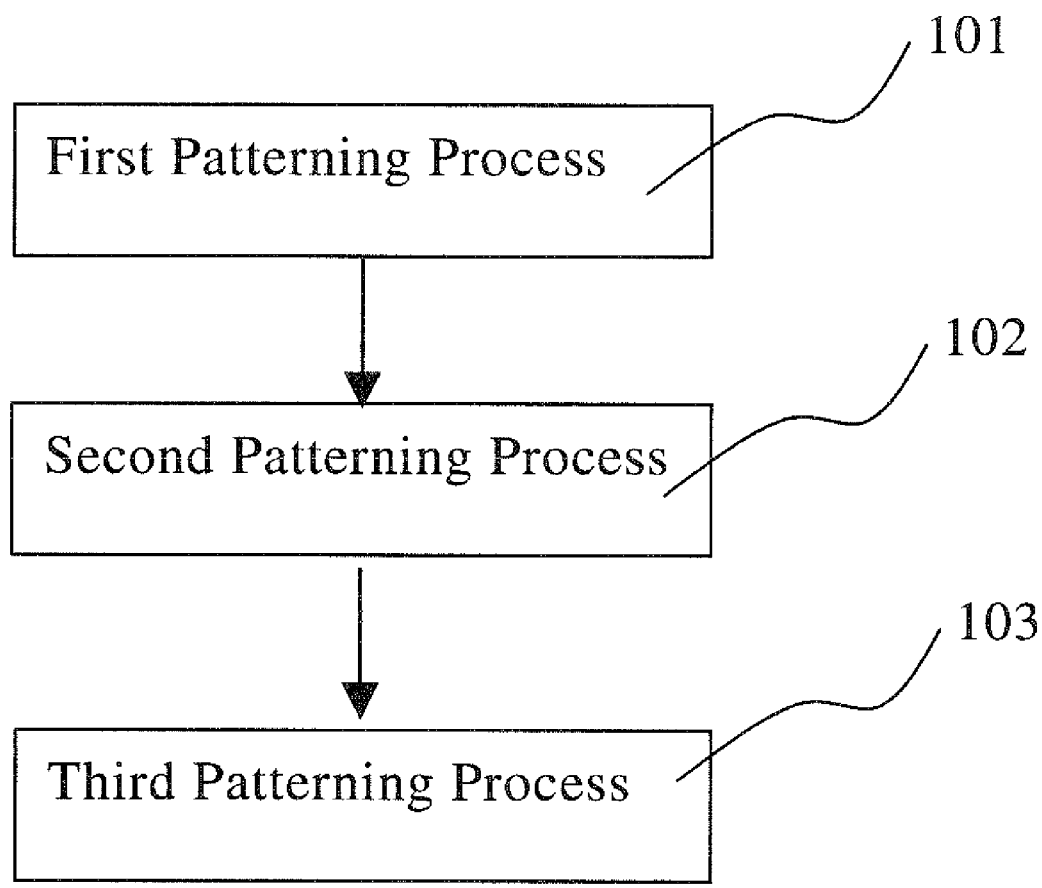
FIG. 1 is a flow chart showing a method of manufacturing an array substrate of horizontal electric field type transreflective LCD according to a first embodiment of the invention.

FIG. 1 is a flow chart showing a method of manufacturing an array substrate of horizontal electric field type transreflective LCD according to a first embodiment of the invention. As shown in FIG. 1, the method according to the first embodiment of the invention comprises the formation of the pre-preparing layer structure and the formation of the post-preparing layer structure. Specifically, the formation of the pre-preparing layer structure comprises the following steps:

A first patterning process 101 of depositing a first transparent conductive layer 2 and a first metal layer 3 in this order on a base substrate 1, coating a photoresist layer 4 on the base substrate 1 deposited with the first transparent conductive layer 2 and the first metal layer 3, and exposing and developing the photoresist layer 4 with a full tone mask.

Figures 2A, 2B, 2C:
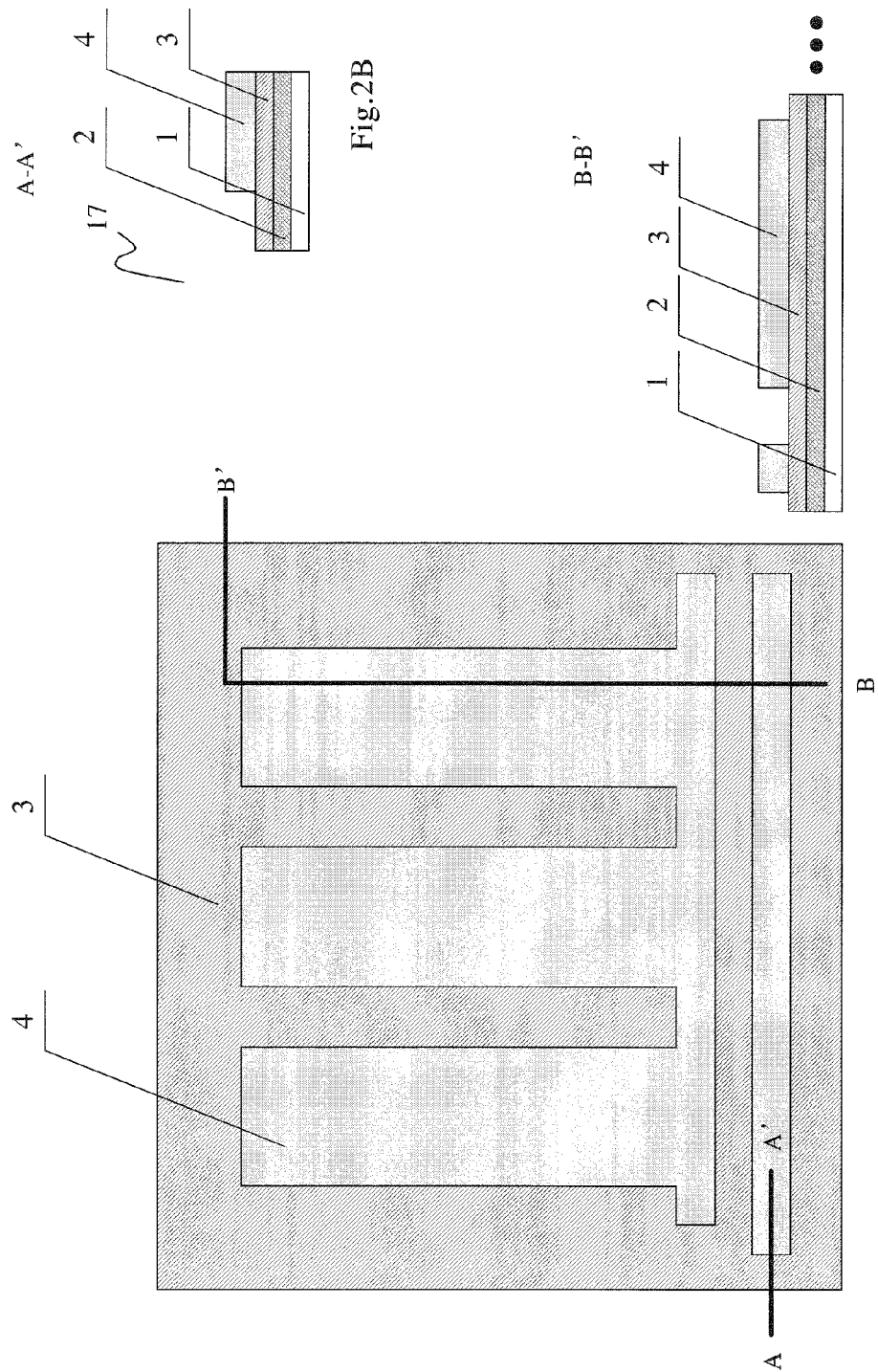
FIG. 2A is a plane view after exposing and developing with a full tone mask in a first patterning process of the method according to the first embodiment of the invention.
FIG. 2B is a sectional view taken along a line A-A' in FIG. 2A.
FIG. 2C is a sectional view taken along a line B-B' in FIG. 2A.

FIG. 2A is a plane view after exposing and developing with a full tone mask in the first patterning process of the method according to the first embodiment of the invention, FIG. 2B is a sectional view taken along a line A-A' in FIG. 2A, and FIG. 2C is a sectional view taken along a line B-B' in FIG. 2A.

As shown in FIG. 2A to FIG. 2C, a first photoresist pattern is obtained after exposing and developing the photoresist layer 4 in the first patterning process. The photoresist layer 4 is remained on the regions where a gate line 11, a common line 13 across a display region to be formed, and a common electrode 14 branching from the common line 13 in the display region are to be formed. At this time, the photoresist layer 4 is remained on a gate line connection portion 17 (see FIG. 2B); while a data line connection 18 portion is not covered by the photoresist layer 4 (see FIG. 2C).

FIG. 3A is a plane view after etching in the first patterning process of the method according to the first embodiment of the invention, FIG. 3B is a sectional view taken along a line A-A' in FIG. 3A, and FIG. 3C is a sectional view taken along a line B-B' in FIG. 3A.

As shown in FIG. 3A to FIG. 3C, the first metal layer 3 and the first transparent conductive layer 2 formed on the base substrate 1 are etched sequentially to form patterns for the display region, the gate line 11 outside the display region, the common line 13 across the display region, and the common electrode 14 branching from the common line in the display region, which are all formed of both the first transparent conductive layer 2 and the first metal layer 3. The base substrate 1 is exposed in the data line connection portion 18 (see FIG. 3C). In the embodiment, a gate electrode of the thin film transistor to be formed is a portion of the gate line, but it may also be a portion branching from the gate line 11.

Then, the photoresist layer 4 is removed by cleaning or stripping to carry out a second patterning process.

A second patterning process 102 of depositing a first insulating layer 5, a semiconductor layer 6, a doped semiconductor layer 7 (i.e., ohmic contact layer) and a second metal layer 8 sequentially on the base substrate 1 after the first patterning process 101, coating a photoresist layer 4, and exposing and developing the photoresist layer 4 with a first dual tone mask.

Figure 4A:
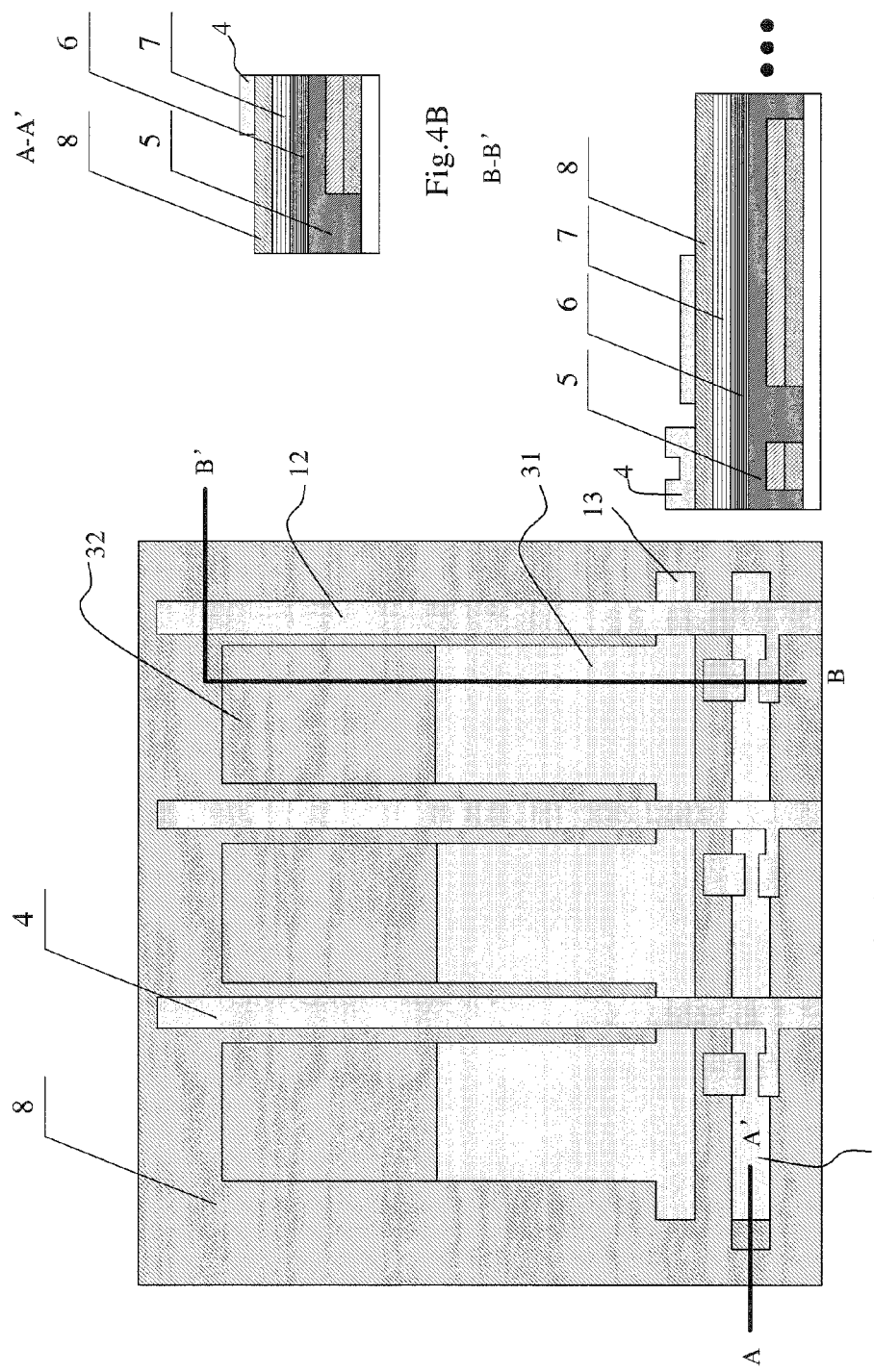
FIG. 4A is a plane view after exposing and developing with a first dual tone mask in a second patterning process of the method according to the first embodiment of the invention.
Figure 4B:
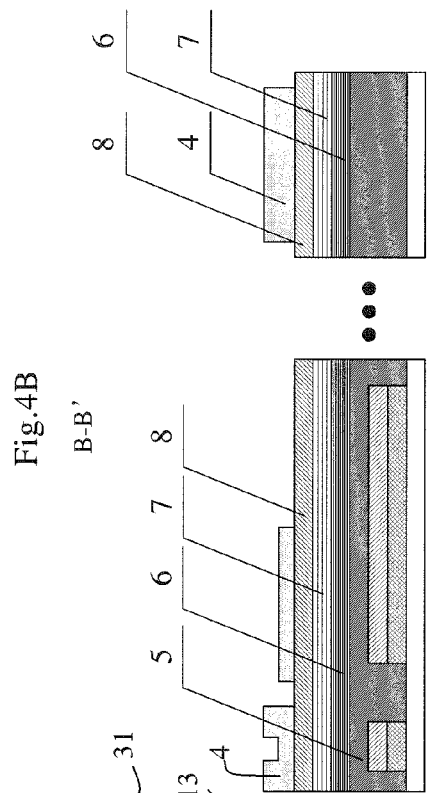
FIG. 4B is a sectional view taken along a line A-A' in FIG. 4A.
Figure 4C:
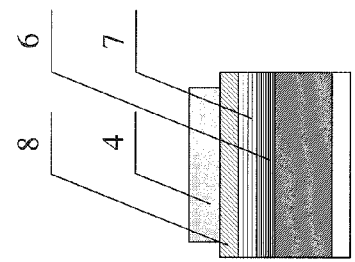
FIG. 4C is a sectional view taken along a line B-B' in FIG. 4A.

FIG. 4A is a plane view after exposing and developing with a first dual tone mask in the second patterning process of the method according to the first embodiment of the invention, FIG. 4B is a sectional view taken along a line A-A' in FIG. 4A, and FIG. 4C is a sectional view taken along a line B-B' in FIG. 4A.

As shown in FIG. 4A to FIG. 4C, a second photoresist pattern is obtained after exposing and developing the photoresist layer 4 in the second patterning process. The photoresist layer 4 is remained on the regions respectively corresponding to the common line 13, a reflective region 31 on the common electrode 14, the gate line 11, a data line 12, a source electrode 15 connected with the data line 12, the drain electrode 16, and a silicon island 30 corresponding to the active layer for the TFT to be formed. Specifically, the photoresist layer 4 remained on the region where the channel region to be formed between the source electrode 15 and the drain electrode 16, the common line 13, the reflective region 31, and the gate line 11 (including the gate electrode) is thinner, and the photoresist layer 4 remained in other regions is thicker. At this time, the second metal layer 8 is exposed at the end of the gate line connection portion 17, and the photoresist layer 4 is remained on the data line connection portion 18.

FIG. 5A is a plane view after etching and ashing the photoresist layer in the second patterning process of the method according to the first embodiment of the invention, FIG. 5B is a sectional view taken along a line A-A' in FIG. 5A, and FIG. 5C is a sectional view taken along a line B-B' in FIG. 5A.

As shown in FIG. 5A to 5C, the second metal layer 8, the doped semiconductor layer 7, the semiconductor layer 6 and the first insulating layer 5 are etched sequentially to form patterns for the silicon island 30 (the region enclosed by the dashed line in FIG. 5A), and the data line 12, to expose the first metal layer 3 in the transmissive region 31 on the common electrode 14 in the display region and to expose the first metal layer 3 in a transmissive region 32 on the common electrode 14 in the display region. Further, the first metal layer 3 is exposed at the end of the gate line connection portion 17.

Then, the photoresist layer 4 is ashed. At this time, the second metal layer 8 is exposed in the channel region on the silicon island 30. The silicon island 30 comprises a stacked layer of the first transparent conductive layer 2, the first metal layer 3, the first insulating layer 5, the semiconductor layer 6, the doped semiconductor layer 7 and the second metal layer 8. The first metal layer 3 is exposed in the transmissive region 32 on the common electrode, and the second metal layer 8 is exposed in the reflective region 31 on the common electrode. In addition, the first metal layer 3 is exposed at the end of the gate line connection portion 17, and the second metal layer 8 is exposed in other region of the gate line connection portion 17. The data line connection portion 18 is still covered by the photoresist layer 4.

FIG. 6A is a plane view after etching once more and removing the photoresist layer in the second patterning process of the method according to the first embodiment of the invention, FIG. 6B is a sectional view taken along a line A-A' in FIG. 6A, and FIG. 6C is a sectional view taken along a line B-B' in FIG. 6A.

As shown in FIG. 6A to FIG. 6C, the array substrate of horizontal electric field type transreflective LCD is etched again. At this time, since the first metal layer 3 and the second metal layer 8 exposed in corresponding regions are formed of metal materials, they are simultaneously etched during the etching process.

Then, the doped semiconductor layer 7 and a portion of the semiconductor layer 6 are etched. At this time, a same etchant is used to etch the doped semiconductor layer 7 and the semiconductor layer 6, but the etchant cannot etch the first transparent conductive layer 2 in the display region.

After etching, the semiconductor layer 6 forms the channel in the channel region on the silicon island 30, and the source electrode 15 connected with the data line 12 and the drain electrode 16 are simultaneously formed. In addition, an electrode is formed with the first transparent conductive layer 2 in the display region. The transmissive region of the display region is formed of the first transparent conductive layer 2, and the reflective region of the electrode is formed of both the first transparent conductive layer 2 and the first metal layer 3 in stack. Also, the first transparent conductive layer 2 is exposed at the end of the gate line connection portion 17, and the semiconductor layer 6 is exposed on the gate line 11.

Then, the photoresist layer 4 is removed to expose the data line 12, the source electrode 15 connected with the data line 12 and the drain electrode 16, and thus the formation of the pre-preparing layer structure is completed.

Subsequently, the formation of the post-preparing layer structure is carried out. The formation of the post-preparing layer structure comprises the following steps.

A third patterning process 103 of depositing a second insulating layer 9 on the substrate after the second patterning process 102, uniformly coating a photoresist layer 4 on the second insulating layer 9, and exposing and developing the photoresist layer 4 with a second dual tone mask.

FIG. 7A is a plane view after exposing and developing in the third patterning process of the method according to the first embodiment of the invention, FIG. 7B is a sectional view taken along a line A-A' in FIG. 7A, and FIG. 7C is a sectional view taken along a line B-B' in FIG. 7A.

As shown in FIG. 7A to FIG. 7C, a third photoresist pattern is obtained after exposing and developing the photoresist layer 4 in the third patterning process. A portion of the region on the drain electrode 16, the gate line connection portion 17 and the data line connection portion 18 are not covered by the photoresist layer 4 and the second insulating layer 9 is exposed in these regions. The photoresist layer 4 in the regions not corresponding to slits 21 in the display region to be formed is thinner, and the photoresist layer 4 in the regions corresponding to the slits 21 and in other regions in the display region is thicker.

FIG. 8A is a plane view after etching in the third patterning process of the method according to the first embodiment of the invention, FIG. 8B is a sectional view taken along a line A-A' in FIG. 8A, and FIG. 8C is a sectional view taken along a line B-B' in FIG. 3A.

As shown in FIG. 8A to FIG. 8C, the second insulating layer 9 is etched, and the second metal layer 8 is exposed in the portion of the region on the drain electrode 16, that is, a via hole 22 in the second insulating layer 9 is formed on the drain electrode 16. The first transparent conductive layer 2 is exposed at the end of the gate line connection portion 17 and the semiconductor layer 6 is exposed in other region of the gate line connection portion 17. The second metal layer 8 is exposed in the data line connection portion 18.

Then, the photoresist layer 4 is ashed. At this time, the second insulating layer 9 is exposed in the regions not corresponding to the slits 21 in the display region.

FIG. 9A is a plane view after lifting-off the photoresist layer in the third patterning process of the method according to the first embodiment of the invention, FIG. 9B is a sectional view taken along a line A-A' in FIG. 9A, and FIG. 9C is a sectional view taken along a line B-B' in FIG. 9A.

As shown in FIG. 9A to FIG. 9C, after ashing the photoresist layer 4, a second transparent conductive layer 10 is deposited on the substrate with the remained photoresist layer 4, and then the remained photoresist layer is lifted off. At this time, the second transparent conductive layer 10 on the remained photoresist layer is simultaneously removed, and an electrode 20 with slits is formed in the display region and the electrode 20 is connected with the drain electrode 16.

At this time, the second transparent conductive layer 10 is remained at the end of the gate line connection portion 17, and the second transparent conductive layer 10 is electrically connected with the first transparent conductive layer 2, and thus the on/off signal can be transmitted to the gate line 11 through the second transparent conductive layer 10 formed at the end of the gate line connection portion 17. At this time, the second transparent conductive layer 10 is formed in the data line connection portion 18, and the second transparent conductive layer 10 is electrically connected with the second metal layer 8, and thus the electric signal can be transmitted to the data line through the second transparent conductive layer 10 formed in the data line connection portion 18.

According to the method of manufacturing an array substrate of horizontal electric field type transreflective LCD in the embodiment, the patterns for the gate line (including the gate electrode) and the display region are formed by using a full tone mask; the electrode and the channel are formed by using a first dual tone mask, and the first metal layer is remained in the reflective region on the electrode to serve as the reflective plate; and the via hole and the electrode 20 with slits are formed by using a second dual tone mask, and thus the array substrate of horizontal electric field type transreflective LCD is obtained by using one full tone mask and two dual tone masks. In addition, by using the relatively cheaper full tone mask in the method of the embodiment, the production cost is reduced, the process flow is simplified and the production efficiency is improved.

In the embodiment, the reflective plate is formed of the first metal layer, and thus the first metal layer is formed of the metal such as Al which has a transmissivity larger than or equal to 30%.

In the method of manufacturing an array substrate of horizontal electric field type transreflective LCD of the embodiment, the electrode 20 with slits formed in the third patterning process is the pixel electrode.

In the method of manufacturing an array substrate of horizontal electric field type transreflective LCD of the embodiment, the examples of the first dual tone mask and the second dual tone mask comprise a gray tone mask and a half tone mask. The gray tone mask is also referred to as a slit bar mask, in which a semi-transmissive region is formed with the slit pattern by utilizing the diffraction phenomenon of light. The semi-transmissive region of the half-tone mask is formed of the substance such as CrOx and the like, and has a different transmissivity from that of the transmissive region and the non-transmissive region.

In the method of manufacturing an array substrate of horizontal electric field type transreflective LCD of the embodiment, for example, the second metal layer is formed of a single layer of AlNd, Al, Cu, Mo, MoW or Cr, or of a composite layer of any combination of AlNd, Al, Cu, Mo, MoW, Ti and Cr.

In the method of manufacturing an array substrate of horizontal electric field type transreflective LCD of the embodiment, for example, the first insulating layer and the second insulating layer are respectively formed of a single layer of $SiN_x$, $SiO_x$ or $SiO_xN_y$, or of a composite layer of any combination of $SiN_x$, $SiO_x$ and $SiO_xN_y$.

In the method of manufacturing an array substrate of horizontal electric field type transreflective LCD of the embodiment, for example, the semiconductor layer is formed of amorphous silicon, and the doped semiconductor layer is formed of heavily-doped n+ amorphous silicon.

Second Embodiment

Figure 10:
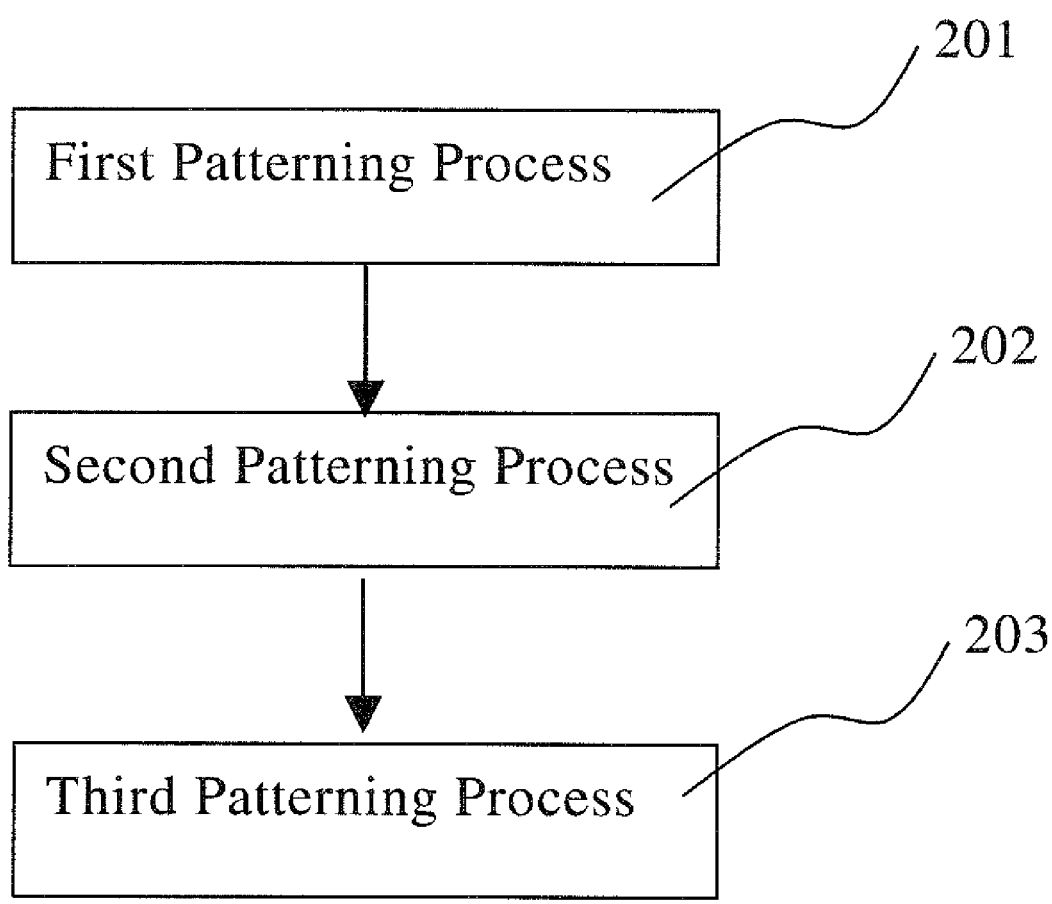
FIG. 10 is a flow chart showing a method of manufacturing an array substrate of horizontal electric field type transreflective LCD according to a second embodiment of the invention.

FIG. 10 is a flow chart showing a method of manufacturing an array substrate of horizontal electric field type transreflective LCD according to a second embodiment of the invention. As shown in FIG. 10, the method according to the second embodiment of the invention comprises the formation of the pre-preparing layer structure and the formation of the post-preparing layer structure. Specifically, the formation of the pre-preparing layer structure comprises the following steps.

A first patterning process 201 of depositing a first transparent conductive layer 2 and a first metal layer 3 sequentially on a base substrate 1, coating a photoresist layer 4 on the base substrate 1 deposited with the first transparent conductive layer 2 and the first metal layer 3, and exposing and developing the photoresist layer 4 with a full tone mask.

FIG. 11A is a plane view after exposing and developing with a full tone mask in the first patterning process of the method according to the second embodiment of the invention, FIG. 11B is a sectional view taken along a line A-A' in FIG. 11A, FIG. 11C is a sectional view taken along a line B-B' in FIG. 11A, and FIG. 11D is a sectional view taken along a line C-C' in FIG. 11A.

As shown in FIG. 11A to FIG. 11D, a first photoresist pattern is obtained after exposing and developing the photoresist layer 4 in the first patterning process. The photoresist layer 4 is remained on the regions where a gate line 11, a common line 13 across a display region and a common electrode 14 branching from the common line in the display region are to be formed. At this time, the photoresist layer 4 is remained on the gate line connection portion 17 (see FIG. 11B) and the common line connection portion 19 (see FIG. 11D)[0], but the photoresist layer 4 is not remained on the data line connection portion 18 (see FIG. 11C).

FIG. 12A is a plane view after etching in the first patterning process of the method according to the second embodiment of the invention, FIG. 12B is a sectional view taken along a line A-A' in FIG. 12A, FIG. 12C is a sectional view taken along a line B-B' in FIG. 12A, and FIG. 12D is a sectional view taken along a line C-C' in FIG. 12A.

As shown in FIG. 12A to FIG. 12D, the first metal layer 3 and the first transparent conductive layer 2 formed on the base substrate 1 are etched sequentially to form the gate line 11 outside the display region, the common line 13 across the display region and the common electrode 14 branching from the common line in the display region, which are all formed of both the first transparent conductive layer 2 and the first metal layer 3. At this time, the base substrate 1 is exposed in the data line connection portion 18 (see FIG. 12C). In the embodiment, a gate electrode of the thin film transistor to be formed is a portion of the gate line, but it may also be a portion branching from the gate line.

Then, the remained photoresist layer 4 is removed to carry out a second patterning process subsequently.

A second patterning process 202 of depositing a first insulating layer 5, a semiconductor layer 6, a doped semiconductor layer 7 (i.e., ohmic contact layer) and a second metal layer 8 on the base substrate 1 after the first patterning process 201, coating a photoresist layer 4, and exposing and developing the photoresist layer 4 with a first dual tone mask.

FIG. 13A is a plane view after exposing and developing with a first dual tone mask in the second patterning process of the method according to the second embodiment of the invention, FIG. 13B is a sectional view taken along a line A-A' in FIG. 13A, FIG. 13C is a sectional view taken along a line B-B' in FIG. 13A, and FIG. 13D is a sectional view taken along a line C-C' in FIG. 13A.

As shown in FIG. 13A to FIG. 13D, a second photoresist pattern is obtained after exposing and developing the photoresist layer 4 in the second patterning process. The photoresist layer 4 is remained on the regions respectively corresponding to the common line 13, a reflective region 31 on the common electrode 14, the gate line 11, a data line 12, a source electrode 15 connected with the data line 12 and a drain electrode 16. Specifically, the photoresist layer 4 on the gate line 11 is thinner, and the photoresist layer 4 on the common line 13, the reflective region 31 on the common electrode 14, the data line 12, the source electrode 15 and the drain electrode 16 is thicker.

At this time, the second metal layer 8 is exposed at the end of the gate line connection portion 17, the photoresist layer 4 is remained on the data line connection portion 18 and the second metal layer 8 is exposed in the contact region of the common line connection portion. The common line connection portion 19 is located within the reflective region of the pixel region.

FIG. 14A is a plane view after etching and ashing the photoresist layer in the second patterning process of the method according to the second embodiment of the invention, FIG. 14B is a sectional view taken along a line A-A' in FIG. 14A, FIG. 14C is a sectional view taken along a line B-B' in FIG. 14A, and FIG. 14D is a sectional view taken along a line C-C' in FIG. 14A.

As shown in FIG. 14A to FIG. 14D, the second metal layer 8, the doped semiconductor layer 7, the semiconductor layer 6 and the first insulating layer 5 are etched sequentially to form patterns for the common line 13, the common electrode 14, the gate line 11 and the data line 12 and to expose the first metal layer 3 in a transmissive region 32 in the display region. At this time, the first metal layer 3 is exposed at the end of the gate line connection portion 17, and the first metal layer 3 is exposed in the contact region of the common line connection portion 19.

Then, the photoresist layer 4 is ashed. At this time, the second metal layer 8 is exposed in the channel region between the source electrode 15 and the drain electrode 16. The first metal layer 3 is exposed in the transmissive region 32 in the display region, and the second metal layer 8 is not exposed in the reflective region 31 of the display region.

At this time, the first metal layer 3 is exposed at the end of the gate line connection portion 17 and the second metal layer 8 is exposed in other region of the gate line connection portion 17. The data line connection portion 18 is still covered by the photoresist layer 4. The first metal layer 3 is exposed in the contact region of the common line connection portion 19, and the photoresist layer 4 is remained in other region of the common line connection portion 19.

Figures 15A, 15B, 15C, 15D:
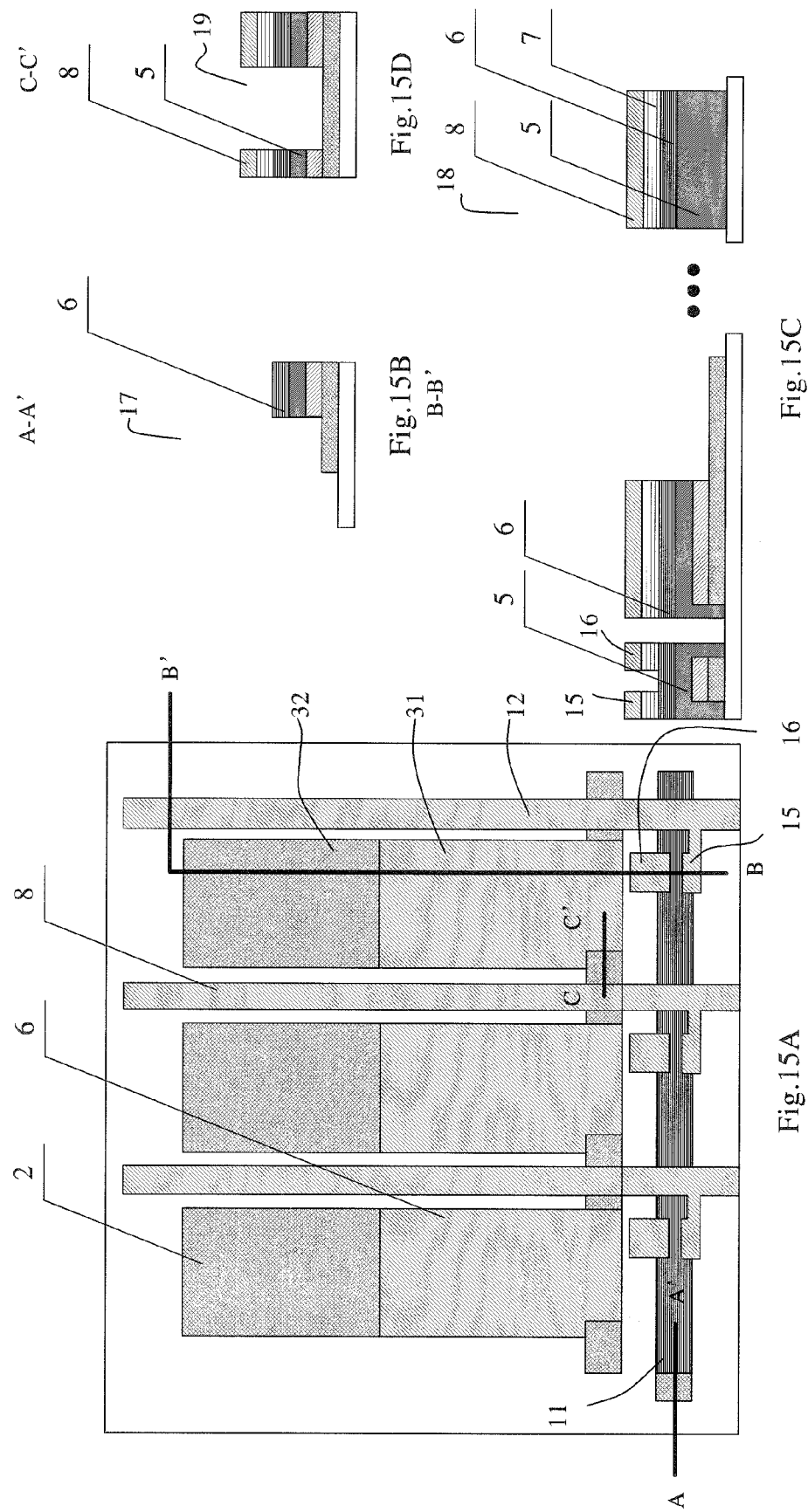
FIG. 15A is a plane view after etching once more and removing the photoresist layer in the second patterning process of the method according to the second embodiment of the invention.
FIG. 15B is a sectional view taken along a line A-A' in FIG. 15A.
FIG. 15C is a sectional view taken along a line B-B' in FIG. 15A.
FIG. 15D is a sectional view taken along a line C-C' in FIG. 15A.

FIG. 15A is a plane view after etching once more and removing the photoresist layer in the second patterning process of the method according to the second embodiment of the invention, FIG. 15B is a sectional view taken along a line A-A' in FIG. 15A, FIG. 15C is a sectional view taken along a line B-B' in FIG. 15A, and FIG. 15D is a sectional view taken along a line C-C' in FIG. 15A.

As shown in FIG. 15A to FIG. 15D, the substrate is subject to etching again. At this time, since the first metal layer 3 and the second metal layer 8 exposed in corresponding regions are formed of metal materials, they are simultaneously etched during the etching process.

Then, the doped semiconductor layer 7 and a portion of the semiconductor layer 6 are etched. At this time, a same etchant is used to etch the doped semiconductor layer 7 and the semiconductor layer 6, while the etchant cannot etch the first transparent conductive layer 2 in the display region.

After etching, the semiconductor layer 6 forms the channel of the TFT in the channel region between the source electrode 15 and the drain electrode 16, and the source electrode 15 connected with the data line 12 and the drain electrode 16 are simultaneously formed. In addition, an electrode is formed on the display region. The transmissive region 32 in the display region is formed of the first transparent conductive layer 2, and the reflective region 31 of the electrode is formed of the stacked layer of the first transparent conductive layer 2, the first metal layer 3, the first insulating layer 5, the semiconductor layer 6, the doped semiconductor layer 7 and the second metal layer 8. The second metal layer 8 is exposed on the common line 13 in the pixel region, and the first transparent conductive layer 2 is exposed on the common line 13 outside the pixel region. At this time, the first transparent conductive layer 2 is exposed at the end of the gate line connection portion 17, and the semiconductor layer 6 is exposed on the gate line 11.

Then, the remained photoresist layer 4 is removed to expose the data line 12, the source electrode 15 connected with the data line 12 and the drain electrode 16. At this time, the second metal layer 8 is exposed in the data line connection portion 18. The first transparent conductive layer 2 is exposed in the contact region of the common line connection portion 19 and the second metal layer 8 is exposed in other region of the common line connection portion 19. Thus the formation of the pre-preparing layer structure is completed. Subsequently, the formation of the post-preparing layer structure is carried out. The formation of the post-preparing layer structure comprises the following steps.

A third patterning process 203 of depositing a second insulating layer 9 on the substrate after the second patterning process 202, uniformly coating a photoresist layer 4 on the second insulating layer 9, and then exposing and developing the photoresist layer 4 with a second dual tone mask.

FIG. 16A is a plane view after exposing and developing in the third patterning process of the method according to the second embodiment of the invention, FIG. 16B is a sectional view taken along a line A-A' in FIG. 16A, FIG. 16C is a sectional view taken along a line B-B' in FIG. 16A, and FIG. 16D is a sectional view taken along a line C-C' in FIG. 16A.

As shown in FIG. 16A to FIG. 16D, a third photoresist pattern is obtained after exposing and developing the photoresist layer 4 in the third patterning process. The region of the via hole 22 on the drain electrode 16, the gate line connection portion 17, the data line connection portion 18 and the common line connection portion 19 are not covered by the photoresist layer 4, and the second insulating layer 9 is exposed in these regions. The photoresist layer 4 in the region of the display region not corresponding to slits 21 to be formed is thinner, and the photoresist layer 4 in the region of the display region corresponding to the slits 21 and in other regions is thicker.

FIG. 17A is a plane view after etching in the third patterning process of the method according to the second embodiment of the invention, FIG. 17B is a sectional view taken along a line A-A' in FIG. 17A, FIG. 17C is a sectional view taken along a line B-B' in FIG. 17A, and FIG. 17D is a sectional view taken along a line C-C' in FIG. 17A.

As shown in FIG. 17A to FIG. 17D, the second insulating layer 9 is etched, and the second metal layer 8 is exposed at the region of the via hole 22 on the drain electrode 16, that is, the via hole 22 in the second insulating layer 9 is formed on the drain electrode 16. The first transparent conductive layer 2 is exposed at the end of the gate line connection portion 17 and the semiconductor layer 6 is exposed in other region of the gate line connection portion 17. The second metal layer 8 is exposed in the data line connection portion 18. The first transparent conductive layer 2 is exposed in the contact region of the common line connection portion 19 and the second metal layer 8 is exposed in other region of the common line connection portion 19.

Then, the photoresist layer 4 is ashed. At this time, the second insulating layer 9 is exposed in the region of the display region not corresponding to the slits 21.

FIG. 18A is a plane view after lifting-off the photoresist layer in the third patterning process of the method according to the second embodiment of the invention, FIG. 18B is a sectional view taken along a line A-A' in FIG. 18A, FIG. 18C is a sectional view taken along a line B-B' in FIG. 18A, and FIG. 18D is a sectional view taken along a line C-C' in FIG. 18A.

As shown in FIG. 18A to FIG. 18D, after ashing the photoresist layer 4, a second transparent conductive layer 10 is deposited on the substrate with the remained photoresist layer 4, and then the remained photoresist layer 4 is lifted off. At this time, the second transparent conductive layer 10 on the remained photoresist layer 4 is simultaneously removed, and an electrode 20 with slits 21 is formed in the display region and the electrode 20 is connected with the drain electrode 16.

At this time, the second transparent conductive layer 10 is formed at the end of the gate line connection portion 17, and the second transparent conductive layer 10 is electrically connected with the first transparent conductive layer 2, and thus the on/off signal can be transmitted to the gate line 11 through the second transparent conductive layer 10 formed at the end of the gate line connection portion 17.

At this time, the second transparent conductive layer 10 is formed in the data line connection portion 18, and the second transparent conductive layer 10 is electrically connected with the second metal layer 8, and thus the electric signal can be transmitted to the data line 12 through the second transparent conductive layer 10 formed in the data line connection portion 18.

At this time, the second transparent conductive layer 10 is formed in the common line connection portion 19, the first transparent conductive layer 2 is connected with the second metal layer 8 through the second transparent conductive layer 10, and the common electric field is formed of the second metal layer 8 in the reflective region 31 of the display region.

In the embodiment, the reflective plate is formed of the second metal layer, and thus the second metal layer is formed of the metal such as Al which has a transmissivity larger than or equal to 30%.

Compared with the first embodiment, the doped semiconductor layer, the semiconductor layer, the first insulating layer, the first metal layer and the first transparent conductive layer are provided below the reflective plate, and thus it is helpful to adjust the cell gap in the reflective region.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method of manufacturing an array substrate of horizontal electric field type transreflective liquid crystal display (LCD), comprising formation of a pre-preparing layer structure and formation of a post-preparing layer structure, wherein the formation of the pre-preparing layer structure comprises:

a first patterning process of forming a first transparent conductive layer and a first metal layer sequentially on a base substrate, coating a first photoresist layer on the first metal layer, exposing and developing the first photoresist layer with a full tone mask to form a first photoresist pattern, etching with the first photoresist pattern to form patterns for a display region, a gate line and a gate electrode which are formed of both the first transparent conductive layer and the first metal layer;

a second patterning process of forming a first insulating layer, a semiconductor layer, a doped semiconductor layer and a second metal layer on the substrate after the first patterning process, coating a second photoresist layer, exposing and developing the second photoresist layer with a first dual tone mask to form a second photoresist pattern, etching with the second photoresist pattern to form patters for a silicon island and a data line, and to expose the first metal layer in a transmissive region in a display region, ashing the second photoresist pattern and then etching again with the remained second photoresist pattern to form a channel on the silicon island, a source electrode connected with the data line and a drain electrode, and to form an electrode in the display region, wherein a reflective region of the electrode is formed of both the first transparent conductive layer and the first metal layer, and a transmissive region of the electrode is formed of the first transparent conductive layer.

2. The method according to claim 1, wherein the second metal layer in the reflective region is exposed in the display region after ashing the second photoresist pattern in the second patterning process.

3. The method according to claim 2, wherein the formation of the post-preparing layer structure comprises:
   a third process of forming a second insulating layer on the substrate after the second patterning process, coating a third photoresist layer on the second insulating layer, exposing and developing the third photoresist layer with a second dual tone mask to form a third photoresist pattern, etching with the third photoresist pattern to form a via hole on the drain electrode, ashing the third photoresist pattern and then depositing a second transparent conductive layer on the remained third photoresist pattern, forming an electrode with slits connected with the drain electrode through the via hole in the display region after lifting off the remained third photoresist pattern.

4. The method according to claim 1, wherein the first metal layer is formed of a metal with a transmissivity larger than or equal to 30%.

5. The method according to claim 2, wherein the first metal layer is formed of a metal with a transmissivity larger than or equal to 30%.

6. The method according to claim 3, wherein the first metal layer is formed of a metal with a transmissivity larger than or equal to 30%.

7. The method according to claim 3, wherein the electrode with slits formed in the third patterning process is a pixel electrode.

8. The method according to claim 1, the second metal layer in a contact region of a common line connection portion is exposed in the reflective region of the display region after exposing and developing with the first dual tone mask in the second patterning process.

9. The method according to claim 8, wherein the formation of the post-preparing layer structure comprises:
   a third patterning process of forming a second insulating layer on the substrate after the second patterning process, coating a third photoresist layer on the second insulating layer, exposing and developing the third photoresist layer with a second dual tone mask to form a third photoresist pattern, etching with the third photoresist pattern to form a via hole on the drain electrode, ashing the third photoresist pattern and then depositing a second transparent conductive layer on the remained third photoresist pattern, forming an electrode with slits connected with the drain electrode through the via hole in the display region after lifting off the remained third photoresist pattern.

10. The method according to claim 8, wherein the second metal layer is formed of a metal with a transmissivity larger than or equal to 30%.

11. The method according to claim 7, wherein the second metal layer is formed of a metal with a transmissivity larger than or equal to 30%.

12. The method according to claim 9, wherein the electrode with slits formed in the third patterning process is a pixel electrode.

13. The method according to claim 1, the electrode formed on the patterns in the display region during the second patterning process is a common electrode.

* * * * *